United States Patent [19]

Ono et al.

[11] 4,231,109
[45] Oct. 28, 1980

[54] SEMICONDUCTOR INTEGRATED CIRCUIT DEVICE

[75] Inventors: Chikai Ono, Kawasaki; Kazuhiro Toyoda, Yokohama, both of Japan

[73] Assignee: Fujitsu Limited, Kawasaki, Japan

[21] Appl. No.: 53,274

[22] Filed: Jun. 29, 1979

[30] Foreign Application Priority Data

Jun. 30, 1978 [JP] Japan .................................. 53-79391
Dec. 29, 1978 [JP] Japan ................................. 53-165131

[51] Int. Cl.³ ............................................ G11C 11/40
[52] U.S. Cl. .................... 365/174; 307/238; 365/155; 365/210; 365/226
[58] Field of Search ................. 307/238; 365/103, 104, 365/174, 189, 226, 210, 154, 155

[56] References Cited

U.S. PATENT DOCUMENTS

| 3,959,781 | 5/1976 | Mehta et al. | 365/210 |
| 3,986,178 | 10/1976 | McElroy et al. | 365/155 |
| 4,081,697 | 3/1978 | Nakano | 365/154 |

*Primary Examiner*—Stuart N. Hecker
*Attorney, Agent, or Firm*—Staas & Halsey

[57] ABSTRACT

An improved semiconductor integrated circuit device having an array of integrated injection logic memory cells arranged in matrix form, with word and bit lines connected to the memory cells arranged in lines. The second word line is formed by a semiconductor bulk, and dummy cells each comprising a shunt circuit for shunting the write current of the memory cells and a hold circuit for supplying a hold current to the memory cells are arranged in each line of the memory array.

12 Claims, 24 Drawing Figures

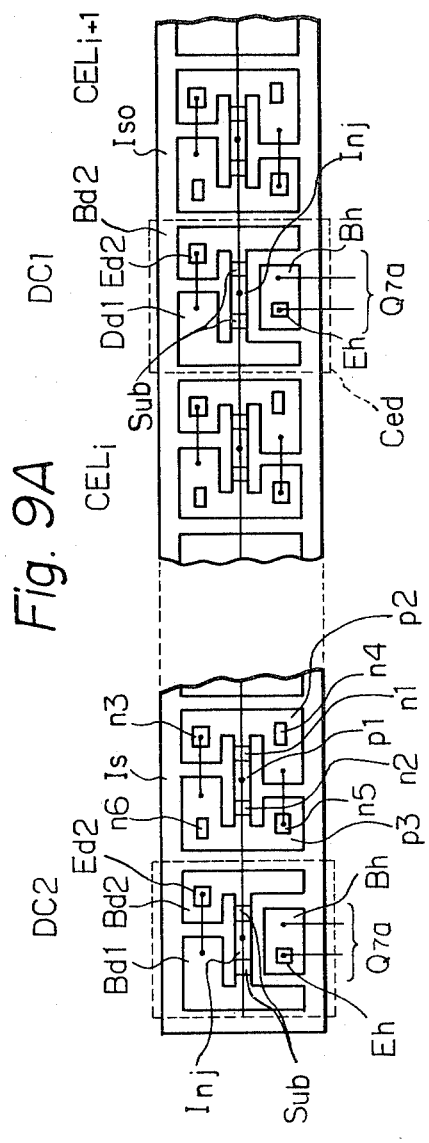
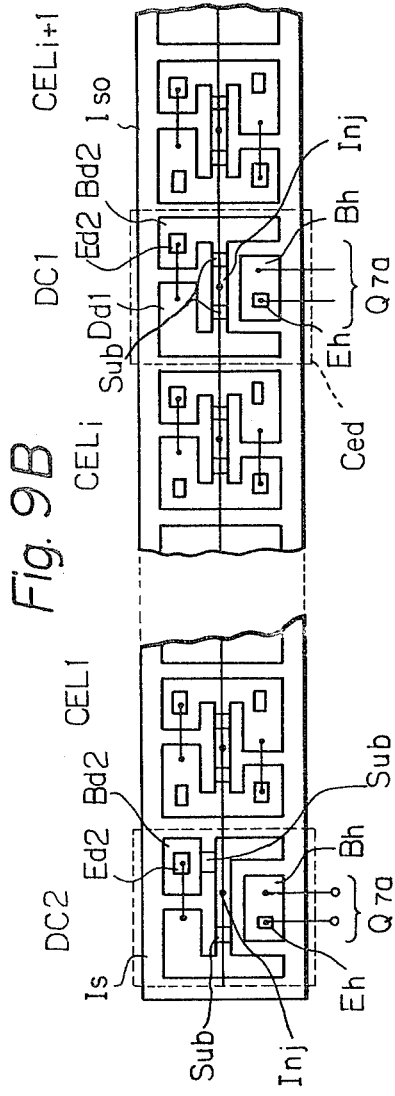

SEMICONDUCTOR INTEGRATED CIRCUIT DEVICE

BACKGROUND OF THE INVENTION

1. Field of the Invention

The present invention relates to an improvement of a semiconductor integrated circuit memory device in which memory cells formed by integrated injection logic are arranged as a memory array.

2. Description of the Prior Art

Recently, a low power semiconductor memory or a high capacity semiconductor memory has been used. In conventional memory cells used in a semiconductor memory, resistors are used as load impedances of flip-flop transistors which are used in the memory cells, and also, an insulation between transistors is required, so that the conventional memory cells are large in size. Therefore, a memory chip is also large in size and the density of the memory chips which are included in one wafer can not be increased, so that the cost of a semiconductor memory is expensive.

For the purpose of obtaining memory cells having small dimensions, memory cells using integrated injection logic are used.

At present, memory cells which are constituted by integrated injection logic are elements of great importance, because such memory cells can be formed with high integration density. Such memory cells are disclosed, for example, in the articles "Write Current Control and Self Powering in a Low Power Memory Cell", IEEE, SSC, Jun., 1973, and "Superintegrated Memory Shares Functions on Diffused Islands", Electronics, Feb. 14, 1972, p83–p86. The former discloses a method of controlling a write current to the integrated injection logic memory cell and the latter discloses a basic idea with respect to the integrated injection logic memory cell.

As disclosed in the above mentioned articles, the integrated injection logic memory cell comprises a pair of first and second transistors which have emitters forming an injector which is connected to a word line W+, and said first and second transistors have emitters of a first conductivity type, a pair of third and fourth transistors which have a collector connected to a collector of the first or second transistors, a base of the third transistor which is connected to the collector of said fourth transistor and a base of the fourth transistor which is connected to the collector of said third transistor, and both said third and fourth transistors having emitters of a second, conductivity type opposite to said first type, and a bulk that is a word line W— which is connected to the bases of the first and second transistors and to emitters of the third and fourth transistors.

The integrated injection logic memory cells are arranged as the memory array. In these integrated injection logic memory cells, the word line W— is formed as the bulk, as already mentioned, and this bulk consists of two n type layers, an epitaxial layer and a buried layer. The epitaxial layer is formed on the buried layer which has a higher density of the impurity than the epitaxial layer. Therefore, the bulk, that is, the word line W— has a larger resistance than a metallic wire, and this resistance exists between each cell.

When the bulk is used as the word line W— which supplies the hold current, the characteristics of the cells are different in accordance with the positions of the cells in the line of the array.

That is, the following problems are caused in the memory device in which memory cells formed by integrated injection logic are arranged as a memory array.

(a) Deviation of a hold current

Since the word line W—, which is provided for supplying a hold current $I_H$ to each cell, has a resistance, the hold current which is supplied to the cell positioned farthest from the hold current supply transistor is small. The value of the hold current $I_H$ should be of sufficient value for holding the state of the cell which is at the most remote position from the hold current supply transistor. Therefore, an excess hold current is supplied to the cells positioned near the hold current supply transistor, so that excess power is dissipated in the memory device. Further, in accordance with the deviation of the hold current of the cell, the write characteristics of the cells are dependent on the position of the cells, because it is well known that a write threshold current to the cell is proportional to the injector current of the cell. A large injector current is supplied to the cell to which a large hold current is supplied. Therefore, the write threshold current of the cell near the hold current supply transistor increases.

(b) The write threshold current to the cell near the end of the memory array increases.

If, there is no deviation of the hold currents are illustrated in the above-item (a), the write threshold current to the cell near the end of the memory array increases. This is due to the reason that the write current flows also to non-selected cells, and this write current in the non-selected cell flows to the injector region of the cell. Therefore, the amount of the current shunted to the non-selected cell is different in accordance with whether or not the non-selected cells exist on both sides of the selected cell. Therefore, when only one non-selected cell exists at one side of the selected cell, the amount of the current shunted to the non-selected cell is small; therefore the current which flows in the selected cell as the injector current is large and the amount of the write threshold current also increases.

When we assume that the write current is constant, the increase of the write threshold current illustrated in the items (a) and (b) above results in an increase of the width of the minimum write pulse. The increases of the write threshold current and the width of the write pulse requires excess electrical power and also deteriorates the characteristics of the cells which are used as the random access memory.

OBJECTS AND SUMMARY OF THE INVENTION

An object of the present invention is to equalize the characteristics of the integrated injection logic memory cells which are arranged as a memory array.

Another object of the present invention is to prevent the increases of the write threshold current and the width of the write pulse which happen when a memory cell array is formed by integrated injection logic memory cells and to improve the characteristics of the random access memory.

A further object of the present invention is the equalization of the hold current supplied to each cell and at the same time to prevent the increase of the write threshold current to each cell without decreasing the density of the integration.

For achieving the above-mentioned objects, the semiconductor integrated circuit according to the present invention comprises integrated injection logic memory cells which are arranged in matrix form, word lines which are connected to the memory cells arranged in a row direction or a column direction and with the one supplying the hold current being formed by a semiconductor bulk. The characteristic feature of the present invention is that dummy cells, which include a shunt circuit for shunting a write current of the memory cell and a hold circuit for supplying a hold current to the memory cell, are arranged in each line of the memory array.

Further features and advantages of the present invention will be apparent from the ensuing description with reference to the accompanying drawings to which, however, the scope of the invention is in no way limited.

BRIEF DESCRIPTION OF THE DRAWINGS

FIGS. 9A and 9B illustrate patterns of essential portions of the arrays which are formed by using the dummy cells shown in FIGS. 7A and 7B;

DETAILED DESCRIPTION OF PREFERRED EMBODIMENTS

Figure 1A:
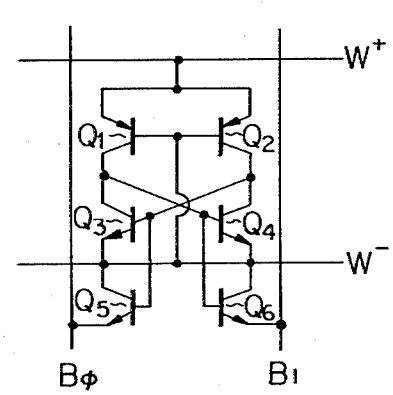
FIGS. 1A, 1B and 1C illustrate equivalent circuits of a memory cell corresponding to one bit of a memory array formed by the integration logic memory cell.
Figure 1B:
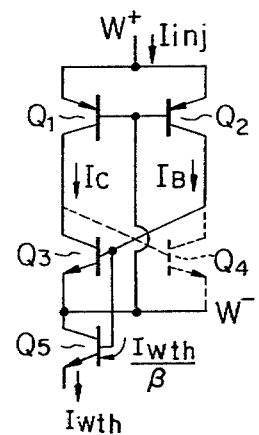

FIG. 1A is an illustration of an equivalent circuit corresponding to one memory cell which is formed by integrated injection logic. In FIG. 1A, $Q_1$ through $Q_6$ designate transistors, $W+$ and $W-$ designate word lines and $B_1$, $B_\phi$ designate bit lines, respectively. FIG. 2 illustrates a cross sectional view of the memory array formed by the integrated memory cells shown in FIG. 1. In FIG. 2, symbols which are the same as in FIG. 1 designate corresponding parts to those illustrated in FIG. 1.

Referring to FIGS. 1A and 2, a p type conduction region which is connected to the word line $W+$ is an injector, and the p type conduction region is actuated as the common emitters of lateral pnp transistors $Q_1$, $Q_2$. This is understood when FIG. 2 is compared with FIG. 1A. As illustrated in FIGS. 1A and 2, the transistors $Q_1$ and $Q_2$ are used as loads, the usual collector regions of npn transistors $Q_3$ and $Q_4$ are connected to a word line $W-$ and used as emitters, and the usual emitter regions of npn transistors $Q_3$ and $Q_4$ are used as collectors. Therefore, a bulk, that is an n type conduction region, which connects in common the bases of the pnp transistors $Q_1$, $Q_2$ and the emitters of the npn transistors $Q_3$, $Q_4$, can be used as a buried word line $W-$, so that the cells can be formed in a high density.

Referring to the memory cell shown in FIG. 1A, transistors $Q_3$ and $Q_4$ are placed in the on and off state alternately. When the transistor $Q_3$ is placed in the on state, the transistor $Q_4$ is placed in the off state. FIG. 1B illustrates an equivalent circuit of FIG. 1A when the transistor $Q_3$ is placed in the on state. An injection current Iinj supplies a base current of an on state transistor $Q_3$. In order to change the cell information, the on state transistor $Q_3$ should be changed to an off state. This is done by supplying an emitter current larger than the write threshold current Iwth to the transistor $Q_5$ and bypassing the base current of the transistor $Q_3$ to the base current of the transistor $Q_5$.

As the base current of the transistor $Q_3$ depends on the injector current Iinj supplied to the injector, the write threshold current Iwth also depends on the injector current Iinj. Therefore, in the conventional memory cells, the write threshold current is large in the cell where the injector current is large.

Figure 1C:
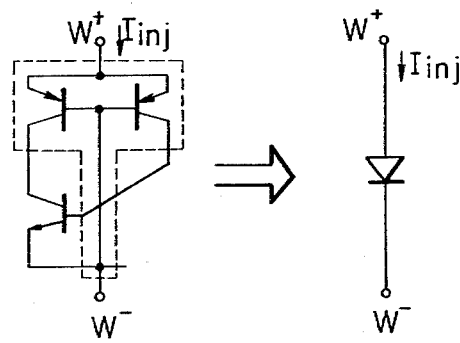
Figure 2:
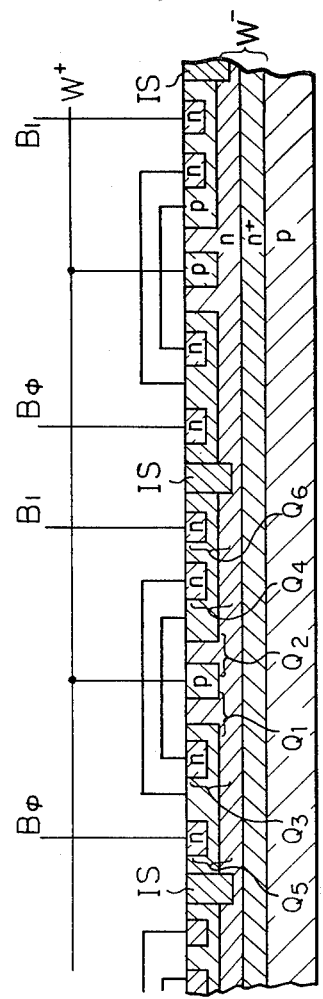
FIG. 2 illustrates a cross section of the memory array formed by the integrated injection logic memory cell.

FIG. 1C shows that an equivalent circuit of a memory cell which is not selected is replaced by an equivalent diode.

Figure 3:
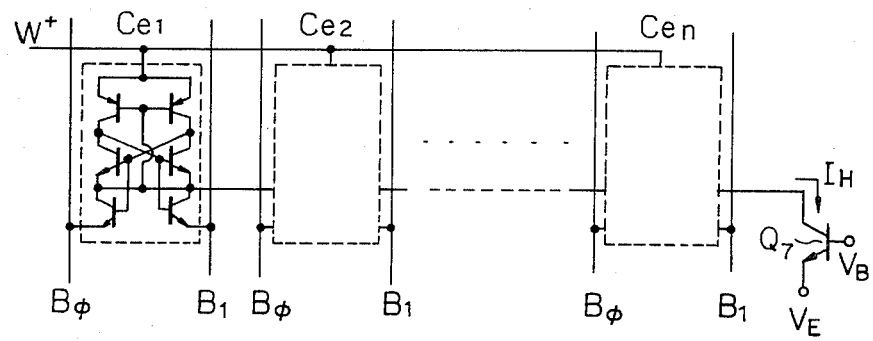
FIG. 3 illustrates an array which forms n bits by using the integrated injection logic memory cells and which includes a hold circuit at one end of the word line.
Figure 4A:
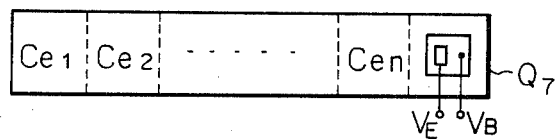
FIGS. 4A and 4B illustrate a plan view and a cross sectional view of the array shown in FIG. 3.
Figure 4B:
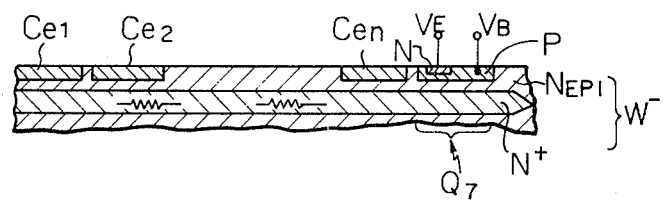

FIG. 3 illustrates one line of a memory array which forms n bits by using the memory cells illustrated in FIGS. 1A and 2. Referring to FIG. 3, $Ce_1$, $Ce_2$, ..., $Ce_n$ designate a first, a second, ..., an n'th cell, respectively. Therefore, the cell array shown in FIG. 3 forms an n bit cell array. A transistor $Q_7$ is provided for supplying hold currents to the cells $Ce_1$, $Ce_2$, ..., $Ce_n$ in the array. It is understood that this hold current supply transistor $Q_7$ is integrated in a common "n" type conduction region which forms the word line $W-$; that is the hold current supply source. FIG. 4A illustrates a plan view of the memory array shown in FIG. 3, and FIG. 4B illustrates a cross sectional view of the memory array shown in FIG. 3. In FIGS. 3, 4A and 4B, the symbol $V_E$ illustrates an emitter terminal and the symbol $V_B$ illustrates a base terminal.

In the memory array shown in FIGS. 3, 4A and 4B, the word line $W-$ is formed by the semiconductor bulk, as already described, and this semiconductor bulk consists of two n type layers, an epitaxial layer and a buried layer. The epitaxial layer is formed on the buried layer which has a higher density of impurity than the epitaxial layer. Therefore, the word line $W-$ has a larger resistance than a metallic layer. This resistance is due to the bulk resistance and this resistance causes the problems of deviation of the hold current and the increase of the write threshold current to the cell near the end of the memory array.

Figure 5A:
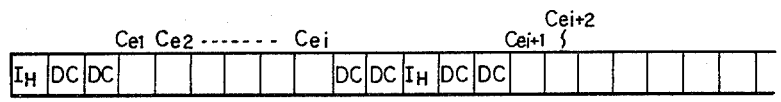
FIGS. 5A, 5B and 5C illustrate known semiconductor integrated circuits.
Figure 5B:
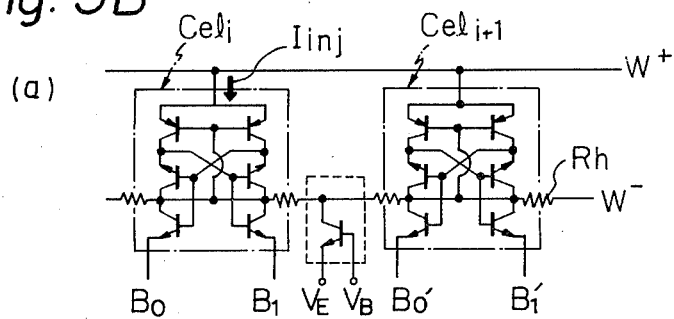
Figure 5C:
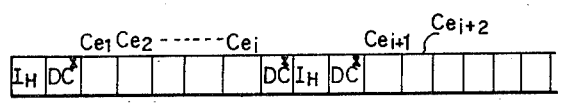

For the purpose of resolving the above-mentioned problems, the array arrangement shown in FIG. 5A is proposed. In the array shown in FIG. 5A, the n cells $Ce_1$, $Ce_2$, ..., $Ce_i$, $Ce_{i+1}$, $Ce_{i+2}$, ..., $Ce_n$ are arranged as a memory array, the hold current supply transistors $I_H$ are distributed so as to equalize the distribution of the hold current and dummy cells DC are distributed at both outside sides of the cells $Ce_1$, $Ce_i$, $Ce_{i+1}$ so as to shunt the injector current supplied to the cell at the end of the cell array. In the circuit shown in FIG. 5A, at least one dummy cell is required; however, two or more than two dummy cells are required for the purpose of sufficiently compensating for the end effect of the memory cell. It is understood that the dummy cells have to be provided at both sides of the hold current supply transistors which are distributed in the line of the memory array, because the boundary condition is different in the cells positioned at either end of the hold current supply transistors. For example, in the circuit shown in FIG. 5B in which no dummy cells are provided at both sides of the hold current supply transistors, when the write current is supplied to the memory cell $Cel_{(i)}$ or $Cel_{(i+1)}$, the write current is not shunted to the hold current transistor and therefore the write current concentrates in the memory cell $Cel_{(i)}$ or $Cel_{(i+1)}$ so that the injector current of this cell increases and also the write threshold current of this cell increases. When more than two dummy cells are required, the plurality of the dummy cells can be replaced by one dummy cell DC* as shown in FIG. 5C by increasing the injector area of the dummy cell so as to increase the shunt current. When the dummy cells DC* shown in FIG. 5C are used, and the hold current sources are distributed at "m" positions, the number of the dummy cells required for forming the array as shown in FIG. 5C is $2m-2$ because each end of the line of the array requires one dummy cell, and each side of each hold current source also requires one dummy cell. When the capacity of the memory increases, the number of the bits increases, the total amount of the resistance $R_H$ increases, the deviation of the hold current $I_H$ also increases, and therefore the number of the "m" has to be increased. Therefore, when the memory cell array has a large capacity, the area of the chip increases so that the integration density decreases.

In the present invention, the integration density can be increased by forming the hold current source and the dummy cell as one body. The present invention is based on the following reason. In the dummy cell, the rewrite or the read out of the information is not carried out as in the memory cell; therefore, for example, the transistors $Q_5$ or $Q_6$ shown in FIG. 1A are not necessary. Also, in the dummy cell, the content of the cell is not questioned; therefore the transistors $Q_3$ and $Q_4$ for holding the information as shown in FIG. 1A are also not necessary. Therefore, the hold current supply transistor $Q_7$ can be formed in the dummy cell by removing the transistors $Q_3$, $Q_4$, $Q_5$ and $Q_6$. Even if the hold current supply transistor $Q_7$ is formed in the dummy cell as illustrated above, the characteristic of the dummy cell between the word lines W+ and W− is equivalent to a one bit cell for the shunt of the write current.

Figure 6A:
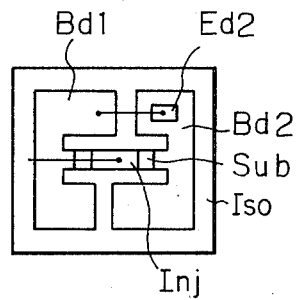
FIGS. 6A, 6B and 6C illustrate patterns of shunt circuits which are proposed for the purpose of preventing the increase of the write threshold current in the arrays shown in FIGS. 5A and 5C.
Figure 6B:
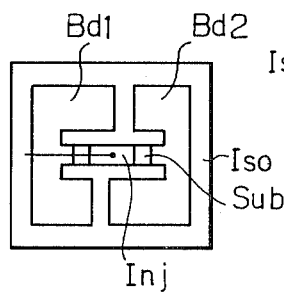
Figure 6C:
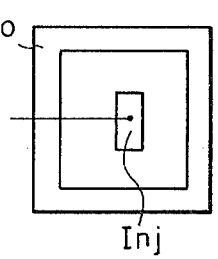

FIGS. 6A, 6B and 6C illustrate a plan view of the patterns of the dummy cells. Referring to FIGS. 6A, 6B and 6C, the region Iso illustrates a passive isolation region, Iinj illustrates an injector region, $Bd_1$, $Bd_2$ illustrates "p" type base regions in the dummy cell, $Ed_2$ illustrates an "n" type emitter region in the dummy cell and Sub illustrates an exposed surface of the n type substrate.

Figure 7A:
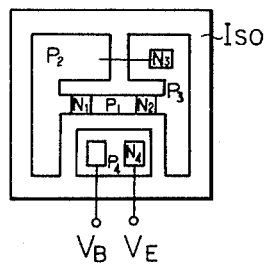
FIGS. 7A, 7B, 7C and 7D illustrate patterns of the dummy cell which are proposed in the present invention.
Figure 7B:
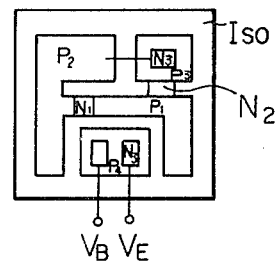
Figure 7C:
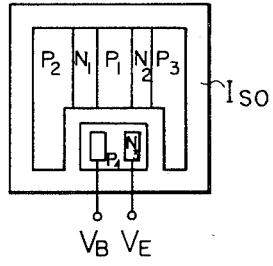
Figure 7D:
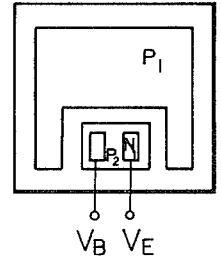

In the present invention, the hold current supply transistor is formed in the dummy cell as illustrated in FIGS. 7A, 7B, 7C and 7D. In FIG. 7A, a pattern of the hold current supply transistor is formed in a part of the dummy cell shown in FIG 6A. An injector area of the PNP transistors $P_1$—$N_1$—$P_2$ and $P_1$—$N_2$—$P_3$ can be enlarged so that the number of the dummy cells can be decreased if the write current in the adjacent cell can be sufficiently shunted. In FIG. 7B and FIG. 7C, the construction of the PNP transistor is simple; therefore the injector area can be enlarged and the dummy cell can be formed with a small dimension. In FIG. 7D, the injector region is formed by only a diode, the construction of the dummy cell is very simple and the injector area can be further enlarged and the dummy cell can be formed with a small dimension when the large injector area is not necessary.

Figure 8A:
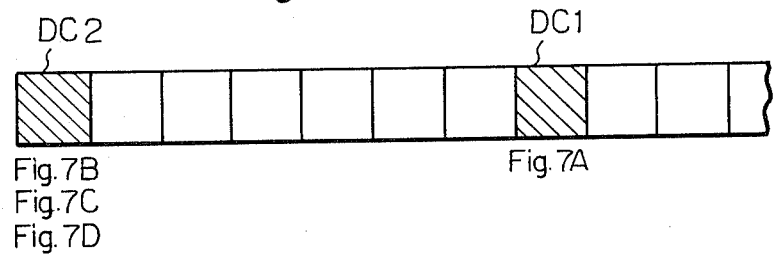
FIGS. 8A and 8B illustrate the arrangement and the equivalent circuit of one embodiment of the array according to the present invention.
Figure 8B:
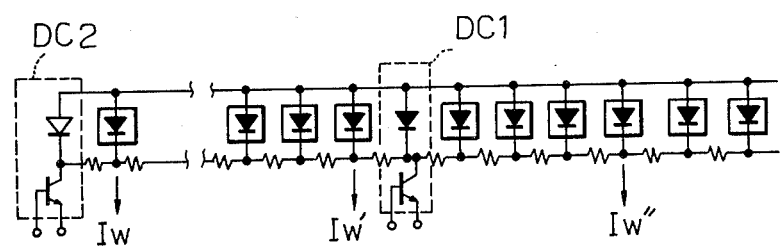

FIGS. 8A and 8B illustrate the plan of the array and the equivalent circuit of the array which is formed by using the memory cells shown in FIGS. 7A, 7B, 7C and 7D. Referring to FIG. 8A, a dummy cell $DS_1$ which is positioned in the midst of the array is formed by using the dummy cell shown in FIG. 7A; and a dummy cell $DC_2$ which is positioned at an end of the array is formed by using the dummy cell shown in FIGS. 7B, 7C and 7D. This is because the shunt effect of the dummy cell $DC_1$ is the same as the usual memory cell at both sides of the dummy cell $DC_1$. It is preferable that the dummy cell $DC_2$ has a large injector having a larger shunt effect of the write current than the usual memory cell.

FIG. 9A illustrates a plan view of a pattern of the memory array when the dummy cells $DC_1$ and $DC_2$ are formed by using the dummy cell shown in FIG. 7A. FIG. 9B illustrates a plan view of a pattern of the memory array when the dummy cell $DC_1$ has a pattern shown in FIG. 7A and the dummy cell $DC_2$ has a pattern shown in FIG. 7B. Referring to FIGS. 9A and 9B, $W_1$ illustrates a word line, $CEL_1$, $CEL_i$, $CEL_{i+1}$ illustrate memory cells, $P_1$ illustrates a p type region which forms a common emitter of the transistor $Q_1$ and $Q_2$ in the memory cell, $n_1$ and $n_2$ illustrate n type regions of the semiconductor layer which form the bases of the transistors $Q_1$ and $Q_2$, $P_2$ and $P_3$ illustrate p type regions which form collectors of the transistors $Q_1$ and $Q_2$ and the bases of the transistors $Q_3$, $Q_4$, $Q_5$ and $Q_6$, $n_3$ illustrates an n type region which forms a collector of the transistor $Q_4$, $n_4$ illustrates an n type region which forms an emitter of the transistor $Q_6$, $n_5$ illustrates an n type region which forms a collector of the transistor $Q_3$, and $n_6$ illustrates an n type region which forms an emitter of the transistor $Q_5$.

Figure 10:
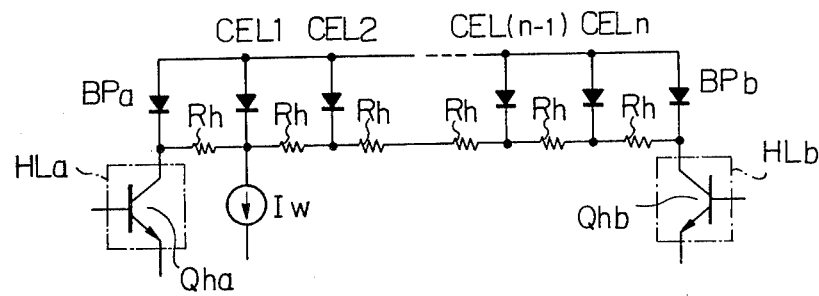
FIG. 10 illustrates an equivalent circuit of one embodiment according to the present invention.

FIG. 10 illustrates an equivalent circuit of another embodiment of the memory array according to the present invention. Referring to FIG. 10, $CEL_1$, ..., $CEL_n$ illustrate memory cells which are illustrated by an equivalent circuit, $BP_a$ and $BP_b$ illustrate shunt circuits, $HL_a$ and $HL_b$ illustrate hold circuits, $Q_{ha}$ and $Q_{hb}$ illustrate transistors for supplying the hold current, and Rh illustrates a resistance due to the semiconductor layer which corresponds to the word line W− shown in FIG. 1A and FIG. 2.

Figure 11A:
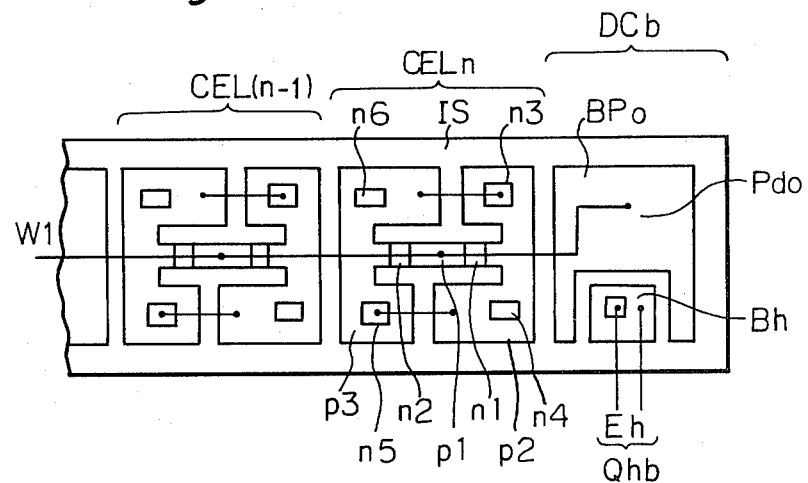
FIGS. 11A and 11B illustrate patterns of the array of the embodiment shown in FIG. 10.

FIG. 11A illustrates a pattern of one embodiment of the memory array shown in FIG. 10. Referring to FIG. 11A, IS illustrates a separation region, BPo illustrates a shunt circuit, Qhb illustrates a hold circuit, $DC_b$ illustrates a dummy cell, $W_1$ illustrates a word line, $CEL_n$, and $CEL_{n-1}$ illustrate memory cells, $p_1$ illustrates a p type region which forms a common emitter of the transistor $Q_1$ and $Q_2$ in the memory cell, $n_1$ and $n_2$ illustrate n type regions of the semiconductor layer which form the bases of the transistors $Q_1$ and $Q_2$, $p_2$ and $p_3$ illustrate p type regions which form collectors of the transistors $Q_1$ and $Q_2$ and the bases of the transistors $Q_3$, $Q_4$, $Q_5$ and $Q_6$, $n_3$ illustrates an n type region which forms a collector of the transistor $Q_4$, $n_4$ illustrates an n type region which forms an emitter of the transistor $Q_6$, $n_5$ illustrates an n type region which forms a collector of the transistor $Q_3$, and $n_6$ illustrates an n type region which forms an emitter of the transistor $Q_5$.

A region Pdo in the shunt circuit $BP_o$ a is p type region and this region is connected to the word line $W_1$ and forms a common emitter region of the injector transistor. This region Pdo corresponds to the p type region $p_1$ in the memory cell. A region Eh in the hold circuit Qhb is an n type region which forms an emitter of the transistor comprising Qhb and a region Bh is a p type region which forms a base of the transistor Qhb.

With reference to FIG. 10, the shunt circuits $BP_a$ and $BP_b$ are formed by one injector in each dummy cell, and the hold circuits $HL_a$ and $HL_b$ are formed by one transistor, so that the area of the dummy cell $DC_b$ formed by the shunt circuit $BP_a$ or $BP_b$ and the hold circuit $HL_a$ or $HL_b$ is smaller than the area of each memory cell. Therefore, the increase of the total area by distributing the dummy cells is very small, the equalization of the hold current in each cell can be obtained and the increase of the write threshold can be prevented. Also, the decrease of the integration density is very small.

Figure 11B:
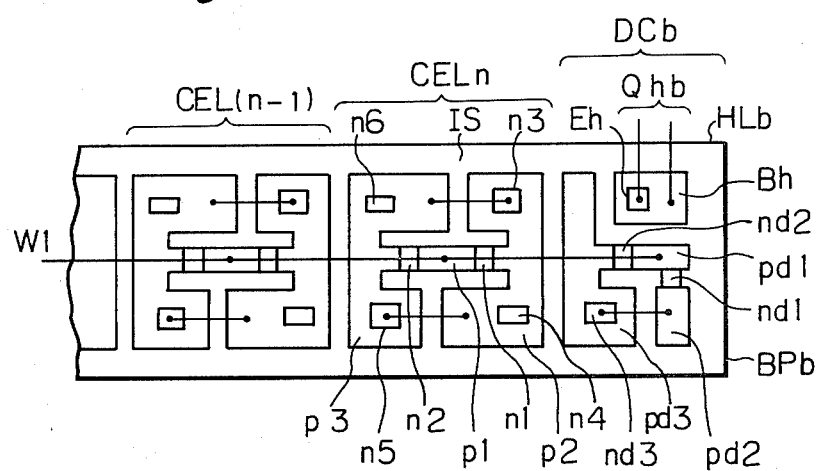

FIG. 11B illustrates a pattern of another embodiment of the memory array shown in FIG. 10. Referring to FIG. 11B, the same symbols used in FIG. 11A illustrate the same elements. Further, referring to FIG. 11B, a shunt circuit $BP_b$ includes a p type region pd1, which corresponds to the emitters of the transistors $Q_1$ and $Q_2$ connected to the word line $W_1$, a p type region pd2 which corresponds to the collector of the transistor $Q_1$ and the base of the transistor $Q_4$, a p type region pd3 which corresponds to the base of the transistor $Q_3$ and an n type region nd3 which corresponds to the collector of the transistor $Q_3$.

Also in the embodiment shown in FIG. 11B, the area of the dummy cell which is formed by the shunt circuit $BP_a$ or $BP_b$ and the hold circuit $HL_a$ or $HL_b$ is smaller than that of the memory cell, and the effect on the integration density is very small.

As explained in detail above, according to the present invention, the increase of the write threshold current due to the deviation of the hold current, which occurs when the memory cell array is formed by the integrated injection logic memory cells, can be removed by distributing the hold current supply transistors in the memory cell array. Therefore, the increase of the write threshold circuit can be obviated by combining the dummy cells, regardless of the position of the memory cell which is selected. Therefore, the increase of the write pulse width can be obviated and, as a whole, the characteristics of the random access memory can be improved. Further the density of the integration can be increased by making the dummy cell and the hold current supply transistor in the area smaller than the one bit area of the memory cell, because it is not necessary to rewrite or to read out the information of the dummy cell and therefore at least two transistors can be omitted.

We claim:

1. A semiconductor integrated circuit device having an array of integrated injection logic memory cells, each said memory cell comprising first and second transistors having common emitters of a first conduction type and comprising an injector of the cell, third and fourth transistors having emitters of a second conduction type opposite to said first conduction type with their collectors respectively connected to the collectors of said first and second transistors, said third transistor having its base connected to the collector of said fourth transistor and said fourth transistor having its base connected to the collector of said third transistor, said first and second transistors having bases connected in common and to the emitters of said third and fourth transistors, and first and second word lines along respective lines of said array, each said first word line being connected to said injectors of the cells of the respective line of the array and each said second word line being similarly connected to the bases of said first and second transistors, said semiconductor integrated circuit device comprising each said second word line comprising a semiconductor bulk portion, dummy cells distributed in each said line of said memory cell array, each of said dummy cells comprising a shunt circuit for shunting a respective portion of a write current supplied to selected ones of said integrated injection logic memory cells of the respective line of cells, each of said shunt circuits comprising an injector, and a hold current supply transistor for selectively supplying a hold current to said memory cells of said respective line of cells.

2. A semiconductor integrated circuit device according to claim 1, each said memory cell further comprising fifth and sixth transistors having emitters of said second conduction type with their bases respectively connected to the bases of said third and fourth transistors, their collectors connected to said second word line, and their emitters connected to said first and second bit lines respectively.

3. A semiconductor integrated circuit device according to claim 1, each said injector of each said shunt circuit having the same area as that of said injectors of said memory cells at least in the vicinity of the respective dummy cell in the respective line of memory cells.

4. A semiconductor integrated circuit device according to claim 3, at least selected ones of said shunt circuits in said dummy cells comprising a first region of said first conduction type corresponding to the common emitter of said first and second transistors, first and second regions of said second conduction type respectively corresponding to the bases of said first and second transistors, a second region of said first conduction type corresponding to the collector of said first transistor, and a third region of said first conduction type corresponding to the collector of said second transistor.

5. A semiconductor integrated circuit device according to claim 4, said dummy cells each further comprising a third region of said second conduction type corresponding to the collector of said third transistor, said collector of said first transistor being connected to said collector of said third transistor and said third region of said first conduction type corresponding also to the base of said third transistor.

6. A semiconductor integrated circuit device according to claim 1, wherein each said shunt circuit of said dummy cells has an injector with a larger area than that of each said injector of said memory cells.

7. A semiconductor integrated circuit device according to claim 6, each said shunt circuit of said dummy cells comprising a first region of said first conduction type corresponding to the emitters of said first and second transistors, first and second regions of said second conduction type corresponding to the bases of said first and second transistors, respectively, a second region of said first conduction type corresponding to the collector of said first transistor, and a third region of said first conduction type corresponding to the collector of said second transistor.

8. A semiconductor integrated circuit device according to claim 7, each said dummy cell further comprising a third region of said second conduction type corresponding to the collector of said third transistor, said collector of said first transistor being connected to said collector of said third transistor and said third region of said first conduction type also corresponding to the base of said third transistor.

9. A semiconductor integrated circuit device according to claim 1, each said shunt circuit of said dummy cells comprising a diode connected between said first and said second word lines.

10. A semiconductor integrated circuit device according to claim 1, comprising one of said dummy cells located at each end of each line of said memory cell array, and at least one of said dummy cells located away from one of said ends of said lines, each said injector of said dummy cells at the ends of said lines having an area that is larger than that of the shunt circuit included in the dummy cells located away from said ends.

11. The device of claim 10, comprising said dummy cells located away from said ends of each said line of said array being distributed singly among said memory cells and having said injector areas of said non-end-located dummy cells equal to the injector areas of said memory cells of the respective array line.

12. A semiconductor integrated circuit device according to claim 1, wherein said shunt circuit which is distributed in each said line of said memory array is connected between said firt word line and said second word line.

* * * * *

UNITED STATES PATENT AND TRADEMARK OFFICE
CERTIFICATE OF CORRECTION

PATENT NO. : 4,231,109
DATED : October 28, 1980
INVENTOR(S) : Chikai Ono et al

It is certified that error appears in the above—identified patent and that said Letters Patent is hereby corrected as shown below:

```
Column 1, line 53, after "second" delete --,--.
Column 2, line 29, after "If" delete --,--.
Column 6, line 14, "DS₁" should be --DC₁--;
          line 32, "P₁" should be --p₁--;
          line 33, "transistor" should be --transistors--;
          line 34, "typeregions" should be --type regions--;
          line 36, "P₂ and P₃" should be --p₂ and p₃--;
          line 62, "sistor" should be --sistors--.
*Column 7, line 5, "a is" should be --is a--.
```

Signed and Sealed this

Seventh Day of April 1981

[SEAL]

Attest:

RENE D. TEGTMEYER

Attesting Officer     Acting Commissioner of Patents and Trademarks